(12) United States Patent
Sherwood et al.

(10) Patent No.: US 9,087,649 B2
(45) Date of Patent: Jul. 21, 2015

(54) VERY LOW INDUCTANCE DISTRIBUTED CAPACITIVE FILTER ASSEMBLY

(75) Inventors: Steven D. Sherwood, Chenango Forks, NY (US); William F. Kienzler, III, Johnson City, NY (US); Keith D. Rose, Binghamton, NY (US); Peter J. Minni, Endwell, NY (US)

(73) Assignee: BAE SYSTEMS CONTROLS INC., Endicott, NY (US)

( * ) Notice: Subject to any disclaimer, the term of this patent is extended or adjusted under 35 U.S.C. 154(b) by 358 days.

(21) Appl. No.: 13/592,028

(22) Filed: Aug. 22, 2012

(65) Prior Publication Data
US 2014/0055213 A1    Feb. 27, 2014

(51) Int. Cl.
| H03H 7/01 | (2006.01) |
| H01G 4/38 | (2006.01) |
| H04B 15/00 | (2006.01) |
| H01G 2/06 | (2006.01) |
| H01G 2/10 | (2006.01) |
| H01G 4/224 | (2006.01) |

(52) U.S. Cl.
CPC . *H01G 4/38* (2013.01); *H01G 2/06* (2013.01); *H01G 2/106* (2013.01); *H01G 4/224* (2013.01); *H03H 7/01* (2013.01); *H04B 15/005* (2013.01); *Y10T 29/43* (2015.01)

(58) Field of Classification Search
CPC ........... H01G 4/38; H01G 2/06; H01G 4/224; H04B 15/00; H03H 7/01
USPC ........... 333/181, 182, 185, 252; 361/748, 763
See application file for complete search history.

(56) References Cited

U.S. PATENT DOCUMENTS

| 4,705,332 A | 11/1987 | Sadigh-Behzadi |
| 5,297,970 A | 3/1994 | Carney |
| 5,383,098 A | 1/1995 | Ma et al. |
| 5,909,350 A | 6/1999 | Anthony |
| 5,959,829 A | 9/1999 | Stevenson et al. |
| 5,973,906 A | 10/1999 | Stevenson et al. |
| 7,115,002 B1 | 10/2006 | Gentry |
| 2007/0257691 A1 | 11/2007 | Lee |

(Continued)

FOREIGN PATENT DOCUMENTS

| JP | 08097070 A | 4/1996 |
| JP | 1101670 A | 1/1999 |

(Continued)

*Primary Examiner* — Benny Lee
*Assistant Examiner* — Rakesh Patel
(74) *Attorney, Agent, or Firm* — Scully, Scott, Murphy & Presser, P.C.

(57) ABSTRACT

A capacitive filter assembly and method including a housing having a power terminal connection for receiving electrical power. A plurality of capacitors in an electrically parallel configuration coupled to one or more side walls of the housing. The plurality of capacitors electrically communicating with a plurality of respective printed wiring boards (PWB) coupled to the capacitors inside the housing, and the plurality of capacitors being positioned between the power terminal connection in the housing and respective housing ground connections in the housing. A plurality of support structures coupled to the plurality of capacitors, respectively, the plurality of support structures being configured to mate with the respective printed wiring boards, the support structures being mounted in the housing such that the capacitors are coupled to the housing using their respective support structures.

18 Claims, 3 Drawing Sheets

(56) References Cited

U.S. PATENT DOCUMENTS

2010/0026408 A1* 2/2010 Shau .................................. 333/1
2012/0134069 A1* 5/2012 Dooley et al. ................. 361/330

FOREIGN PATENT DOCUMENTS

| WO | WO 98/01906 | 1/1998 |
| WO | WO 02/058137 A2 | 7/2002 |

* cited by examiner

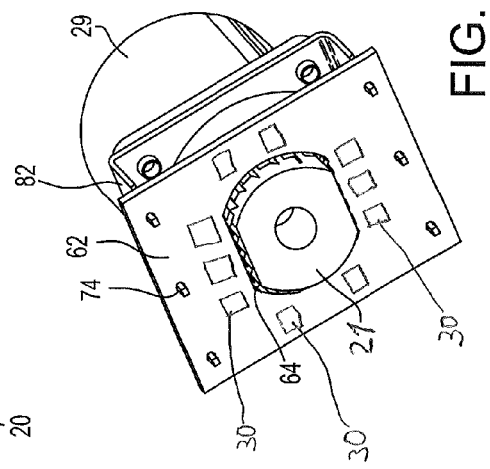
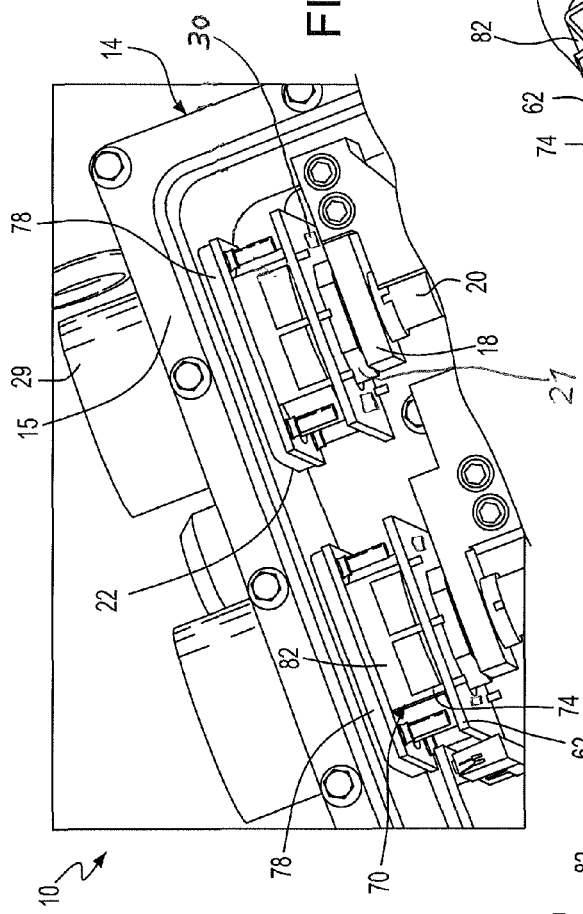
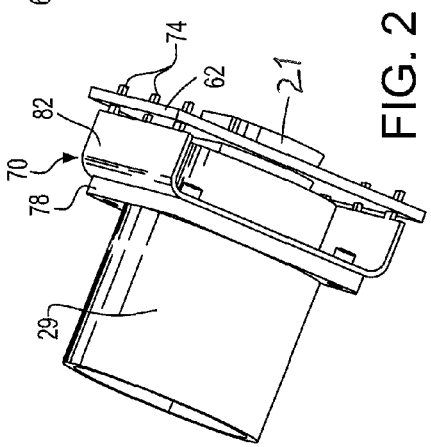

VERY LOW INDUCTANCE DISTRIBUTED CAPACITIVE FILTER ASSEMBLY

STATEMENT REGARDING FEDERALLY SPONSORED RESEARCH OF DEVELOPMENT

This invention was made with United States Government support under Contract No.: W56HZV-09-C-0550, awarded by the U.S. Army. The United States Government has certain rights in this invention.

FIELD OF THE INVENTION

The present invention generally relates to a capacitive filter assembly and method related thereto, for reducing electromagnetic interference from power terminal connections.

BACKGROUND OF THE INVENTION

Electromagnetic interference (EMI) filters may use a capacitor assembly for shielding a conductive terminal. Devices are known which use ceramic chip capacitor designs in EMI filter assemblies. Feedthrough terminal pin assemblies are generally well known in the art for connecting electrical signals through a housing or case of an electronic instrument. A pin assembly may include a unipolar construction having a coaxial ceramic feedthrough filter capacitor in a feedthrough assembly to reduce stray or unwanted EMI signals by suppressing and decoupling undesired interference or noise transmission along a terminal pin.

SUMMARY OF THE INVENTION

A need exists for an assembly or system, and a method, to reduce radiated emission, i.e., electromagnetic interference, at a power assembly terminal. There is also a need for a low inductance capacitive filter having the above features.

In an aspect of the invention, a capacitive filter assembly includes a housing having a power terminal connection for receiving electrical power. A plurality of capacitors in an electrically parallel configuration coupled to one or more side walls of the housing. The plurality of capacitors electrically communicating with a plurality of respective printed wiring boards (PWB) coupled to the capacitors inside the housing, and the plurality of capacitors being positioned between the power terminal connection in the housing and respective housing ground connections in the housing. A plurality of support structures coupled to the plurality of capacitors, respectively, the plurality of support structures being configured to mate with the respective printed wiring boards, the support structures being mounted in the housing such that the capacitors are coupled to the housing using their respective support structures.

In another aspect according to the invention, a method for assembling a capacitive filter includes: connecting a power terminal to a housing for receiving electrical power; configuring a plurality of capacitors electrically parallel to each other and coupled to one or more side walls of the housing, the plurality of capacitors electrically communicating with a plurality of respective printed wiring boards (PWB) coupled to the capacitors inside the housing, the plurality of capacitors being positioned between the power terminal connection in the housing and respective housing ground connections in the housing; and coupling a plurality of support structures to the plurality of capacitors, respectively, the plurality of support structures being configured to mate with the respective printed wiring boards, the support structures being mounted in the housing such that the capacitors are coupled to the housing using their respective support structures.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 1 is an isometric view of a capacitive filter assembly according to an embodiment of the invention;

FIG. 2 is an isometric view of a capacitor, connector and frame of the assembly shown in FIG. 1;

FIG. 3 is a bottom isometric view of the capacitor, connector and frame shown in FIG. 2;

DETAILED DESCRIPTION OF THE INVENTION

Figure 4:
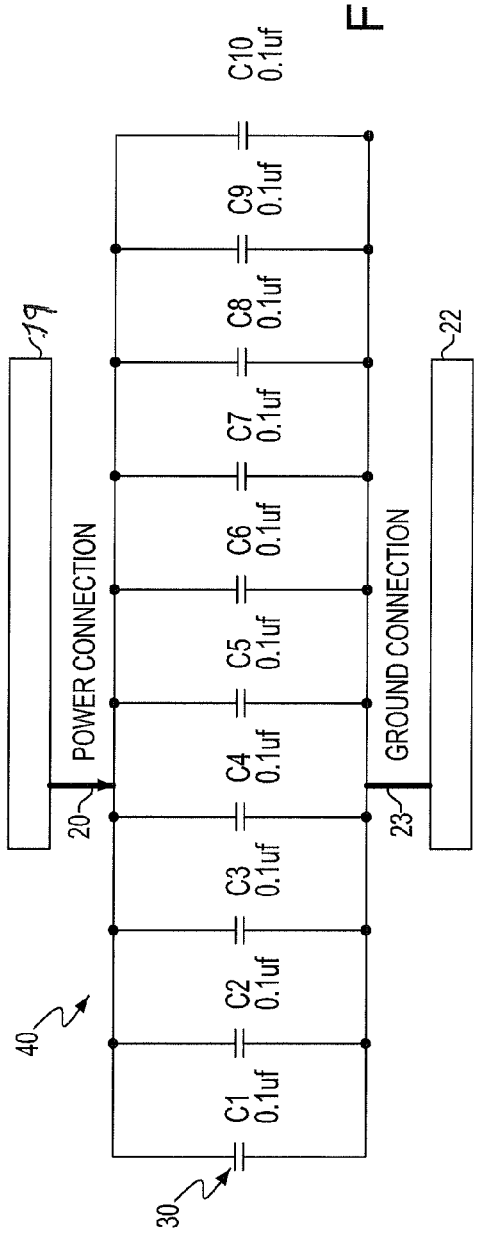
FIG. 4 is an electrical schematic diagram showing a circuit according to an embodiment of the invention having the capacitors in parallel.

Referring to FIG. 1, a capacitive filter assembly 10 according to an embodiment of the invention includes a housing 14 having a power terminal connection 18 and a housing ground connection 22. The assembly 10 shown in FIG. 1 is further depicted in the schematic block diagram representation shown in FIG. 6. The power terminal connection 18 is configured to receive electrical power of a specified voltage via a power connector 20 from a power source 19 (see FIGS. 4 and 6). The voltage may be about 28 volts applied to a DC power terminal, e.g., a power terminal connection 18, wherein the DC power terminal carries about 400 Amps. The power exits from the housing at connector 29. The housing may include a printed wiring board. The power terminal connection may be configured to receive approximately 28 volts of power, in one embodiment of the invention.

A plurality of chip capacitors 30 receive the power terminal connections 18 and are coupled to a plurality of respective printed wiring boards (PWB) 62 and the side wall 15 of the housing 14 using a frame 78 of a support structure 70. The coupling of the power terminal connections 18 using the support structure 70 defines the housing ground connection 22. The plurality of chip capacitors 30 may be in an electrically parallel configuration as shown in the circuit diagrams 40, 50 of FIGS. 4 and 5, respectively. The plurality of chip capacitors 30 are electrically in parallel (or in an electrically parallel configuration) coupled to one or more of the side walls 15 of the housing 14 via the frame. The plurality of chip capacitors 30 are physically connected and electrically communicate with the plurality of respective printed wiring boards (PWB) 62 coupled to each of the chip capacitors 30. The plurality of chip capacitors 30 are positioned between the power terminal connection 18 in the housing 14 and the housing ground connection 22 in the housing 14. FIG. 6 depicts the capacitive filter assembly 10 according to the embodiment of the invention shown in FIG. 1, as a schematic block diagram.

A plurality of support structures 70 are coupled to the plurality of chip capacitors 30, respectively. The plurality of support structures 70 are configured to mate with their respective printed wiring boards 62 mounted in the housing 14 such that the chip capacitors 30 are mounted to the housing 14 using their respective support structures 70. The support structures 70 may also be referred to as mounting brackets.

Referring to FIGS. 2 and 3, the support structures 70 includes a plurality of outwardly biased fingers 74 being configured to mate with corresponding holes (shown with the fingers therethrough), on each of the respective printed wiring boards 62. The support structure 70 includes a frame 78 which has a flange 82 terminating in the plurality of fingers 74. The fingers 74 are biased outwardly to enhance coupling with the PWB 62 by enhancing frictional resistance between the finger 74 and the PWB 62 when the fingers 74 are passed trough the holes in the PWB. The frame 78 surrounds the connector 29 of the chip capacitor 30. A power terminal 21 mates with the power connector 20 and fits into a substantially central hole (shown in FIG. 3) in respective PWBs 62 defining circumferential gap 64 between the power terminal 21 and the PWB such that the spring fingers secure the power terminal 21 to the PWB while maintaining the gap 64, The frame 78 mates with the side wall 15 of the housing 14 to form the ground connection 22.

The chip capacitor 30 may be composed of ceramic. In an embodiment of the invention shown in the circuits 40, 50 shown in the diagrams of FIGS. 4 and 5, the circuits 40, 50 include ten capacitors, however, alternatively embodiments may include greater than ten capacitors. The disclosure herein provides a solution to the need for low inductance in a capacitive filter providing maximization of the attenuation of the filter at high frequencies.

Figure 5:
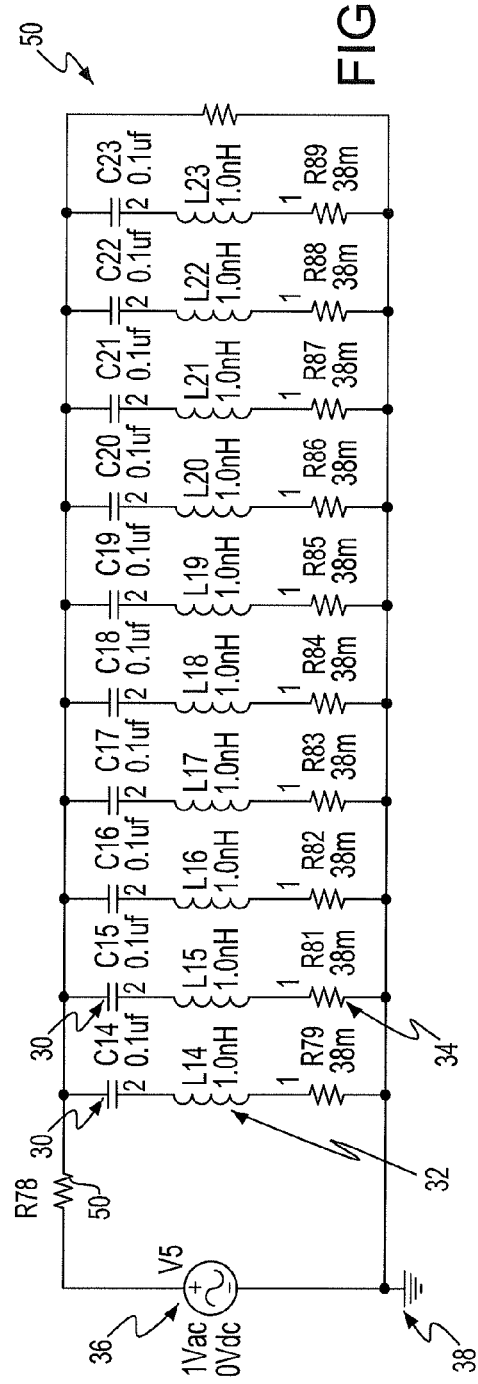
FIG. 5 is an electrical schematic diagram showing a circuit according to an embodiment of the invention having capacitors in parallel, and inductors and resistors in series.
Figure 6:
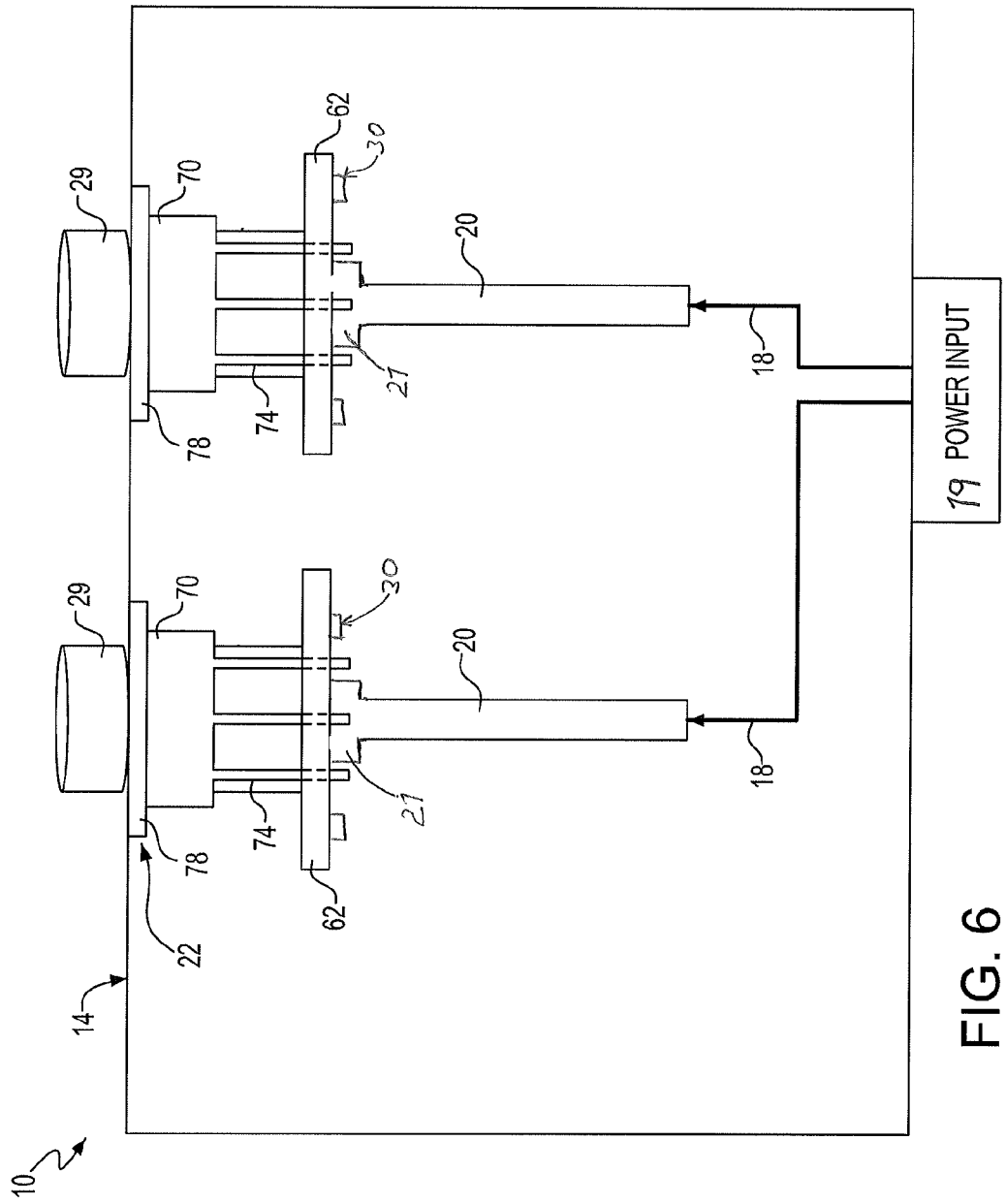
FIG. 6 is a schematic block diagram of the capacitive filter assembly shown in FIG. 1.

Referring to FIGS. 4 and 5, the plurality of chip capacitors 30 may be in an electrically parallel configuration as shown in the circuit diagrams 40, 50 of FIGS. 2 and 3, respectively. The plurality of chip capacitors 30 are electrically in parallel (or in an electrically parallel configuration) coupled to one or more of the side walls 15 of the housing 14 (as shown in FIG. 1). The plurality of chip capacitors 30 are connected to the power source 19 by connector 20, and grounded via connection 23, as shown in FIG. 4. Referring to FIG. 5, the plurality of chip capacitors 30 may be connected to inductors 32 and resistors 34, such as in circuit 50 having an A/C voltage source 36 and ground 38. The inductance and resistance shown in series with each capacitor 30 includes only the parasitic values for each capacitor.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A capacitive filter assembly, comprising:
   a housing having a power terminal connection being configured to receive electrical power;
   a first plurality of capacitors in an electrically parallel configuration coupled to a side wall of the housing, the first plurality of capacitors electrically communicating with a first printed wiring board (PWB) coupled to the first plurality of capacitors inside the housing, the first plurality of capacitors being positioned between the power terminal connection in the housing and a first housing ground connection in the housing, the first PWB having a first plurality of holes; and
   a first support structure coupled to the first plurality of capacitors, the first support structure includes a first plurality of outwardly biased fingers being configured to mate with the first plurality of holes in the first PWB, respectively, the first support structure being mounted in the housing such that the first plurality of capacitors are coupled to the housing using the first support structure.

2. The assembly of claim 1, further comprising:
   a second plurality of capacitors in an electrically parallel configuration coupled to either the side wall or another sidewall of the housing, the second plurality of capacitors electrically communicating with a second printed wiring board (PWB) coupled to the second plurality of capacitors inside the housing, the second plurality of capacitors being positioned between the power terminal connection in the housing and a second housing ground connection in the housing, the second PWB having a second plurality of holes; and
   a second support structure coupled to the second plurality of capacitors, the second support structure includes a second plurality of outwardly biased fingers being configured to mate with the second plurality of holes in the second PWB, respectively, the second support structure being mounted in the housing such that the second plurality of capacitors are coupled to the housing using the second support structure.

3. The assembly of claim 1, wherein the first support structure includes a frame which surrounds the first plurality of capacitors, and the frame is in spaced relation with the first PWB.

4. The assembly of claim 1, wherein the first support structure includes a frame which surrounds the first plurality of capacitors, the frame is attached to outwardly extending opposing flanges which terminate with the first plurality of outwardly biased fingers.

5. The assembly of claim 4, wherein the first plurality of outwardly biased fingers includes at least three fingers in spaced relation to each other.

6. The assembly of claim 1, wherein each of the first plurality of capacitors is a chip capacitor composed of ceramic.

7. The assembly of claim 1, wherein a number of the first plurality of capacitors is ten or greater.

8. The assembly of claim 1, wherein the first support structure includes a frame which at least partially surrounds the first plurality of capacitors.

9. The assembly of claim 1, further comprising a first power terminal and a first power connector, the first power connector mating with the power terminal connection and the first power terminal, wherein the first power terminal fits into a substantially central hole in the first PWB defining a circumferential gap between the first power terminal and the first PWB such that the first plurality of outwardly biased fingers secure the first power terminal to the first PWB while maintaining the circumferential gap.

10. The assembly of claim 1, wherein the power terminal connection is configured for 28 volts of power.

11. A method for assembling a capacitive filter, comprising:
   connecting a power terminal connection to a housing for receiving electrical power;
   configuring a first plurality of capacitors electrically parallel to each other and coupled to a side wall of the housing, the first plurality of capacitors electrically communicating with a first printed wiring board (PWB) coupled to the first plurality of capacitors inside the housing, the first plurality of capacitors being positioned between the power terminal connection in the housing and a first housing ground connection in the housing, the first PWB having a first plurality of holes; and coupling a first support structure to the first plurality of capacitors, the first support structure includes a first plurality of outwardly biased fingers being configured to mate with the first plurality of holes in the first PWB, respectively, the first support structure being mounted in the housing such that the first plurality of capacitors are coupled to the housing using the first support structure.

12. The method of claim 11, further comprising:

configuring a second plurality of capacitors electrically parallel to each other and coupled to either the side wall or another sidewall of the housing, the second plurality of capacitors electrically communicating with a second printed wiring board (PWB) coupled to the second plurality of capacitors inside the housing, the second plurality of capacitors being positioned between the power terminal connection in the housing and a second housing ground connection in the housing, the second PWB having a second plurality of holes; and coupling a second support structure to the second plurality of capacitors, the second support structure includes a second plurality of outwardly biased fingers being configured to mate with the second plurality of holes in the second PWB, respectively, the second support structure being mounted in the housing such that the second plurality of capacitors are coupled to the housing using the second support structure.

13. The method of claim 11, wherein the first support structure includes a frame which surrounds the first plurality of capacitors, and the frame is in spaced relation with the first PWB.

14. The method of claim 11, wherein the first support structure includes a frame which surrounds the first plurality of capacitors, the frame is attached to outwardly extending opposing flanges which terminate with the first plurality of outwardly biased fingers.

15. The method of claim 14, wherein the first plurality of outwardly biased fingers includes at least three fingers in spaced relation to each other.

16. The method of claim 11, wherein a number of the first plurality of capacitors is ten or greater.

17. The method of claim 11, wherein the first support structure includes a frame which at least partially surrounds the first plurality of capacitors.

18. The method of claim 11, wherein the housing further comprises a first power terminal and a first power connector, the first power connector mating with the power terminal connection and the first power terminal, and wherein the first power terminal fits into a substantially central hole in the first PWB defining a circumferential gap between the first power terminal and the first PWB such that the first plurality of outwardly biased fingers secure the first power terminal to the first PWB while maintaining the circumferential gap.

* * * * *